United States Patent [19]

Okunaga

[11] Patent Number: 5,323,356
[45] Date of Patent: Jun. 21, 1994

[54] SEMICONDUCTOR MEMORY DEVICE FOR STORING N-BIT DATA AND 2N-BIT DATA WITHOUT TIME DELAY IN DATA PROPAGATION

[75] Inventor: Kazuo Okunaga, Tokyo, Japan
[73] Assignee: NEC Corporation, Tokyo, Japan
[21] Appl. No.: 79,547
[22] Filed: Jun. 22, 1993
[30] Foreign Application Priority Data Jun. 22, 1992 [JP] Japan .................................. 4-162340

[51] Int. Cl.$^5$ ............................................ G11C 11/40
[52] U.S. Cl. ........................... 365/230.01; 365/230.03
[58] Field of Search ....................... 365/230.01, 230.03, 365/230.05, 230.06, 189.01

[56] References Cited

U.S. PATENT DOCUMENTS 5,170,374 12/1992 Shimohigashi et al. ........ 365/189.01

Primary Examiner—Terrell W. Fears
Attorney, Agent, or Firm—Sughrue, Mion, Zinn, Macpeak & Seas

[57] ABSTRACT

First and second memory cell arrays are incorporated in a semiconductor memory device for storing n-bit data codes and 2n-bit data codes, and first and second data input/output units are respectively provided on the left side of the first memory cell array for the n-bits of the 2n-bit data codes written into or read out from the first memory cell array and on the right side of the second memory cell array for the n-bit data codes and the other n-bits of the 2n-bit data codes written into or read out from the second memory cell array, wherein a third data input/output unit is further provided on the right side of the first memory cell array for the n-bit data codes written into or read out from the first memory cell array instead of a data propagation path from the second data input/output unit to the first memory cell array so that the n-bit data codes and the 2n-bit data codes are written and read out at the same speed.

9 Claims, 6 Drawing Sheets

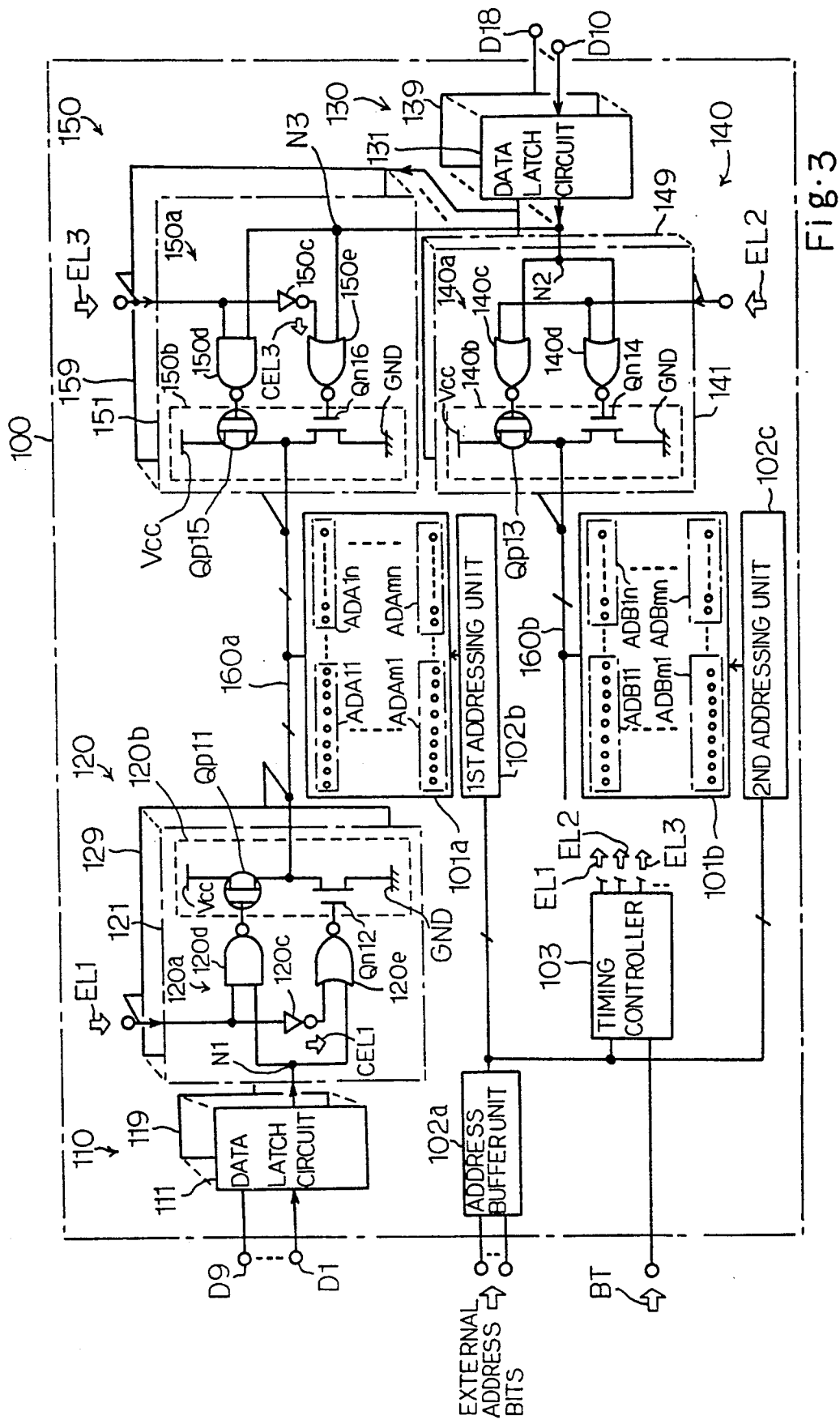

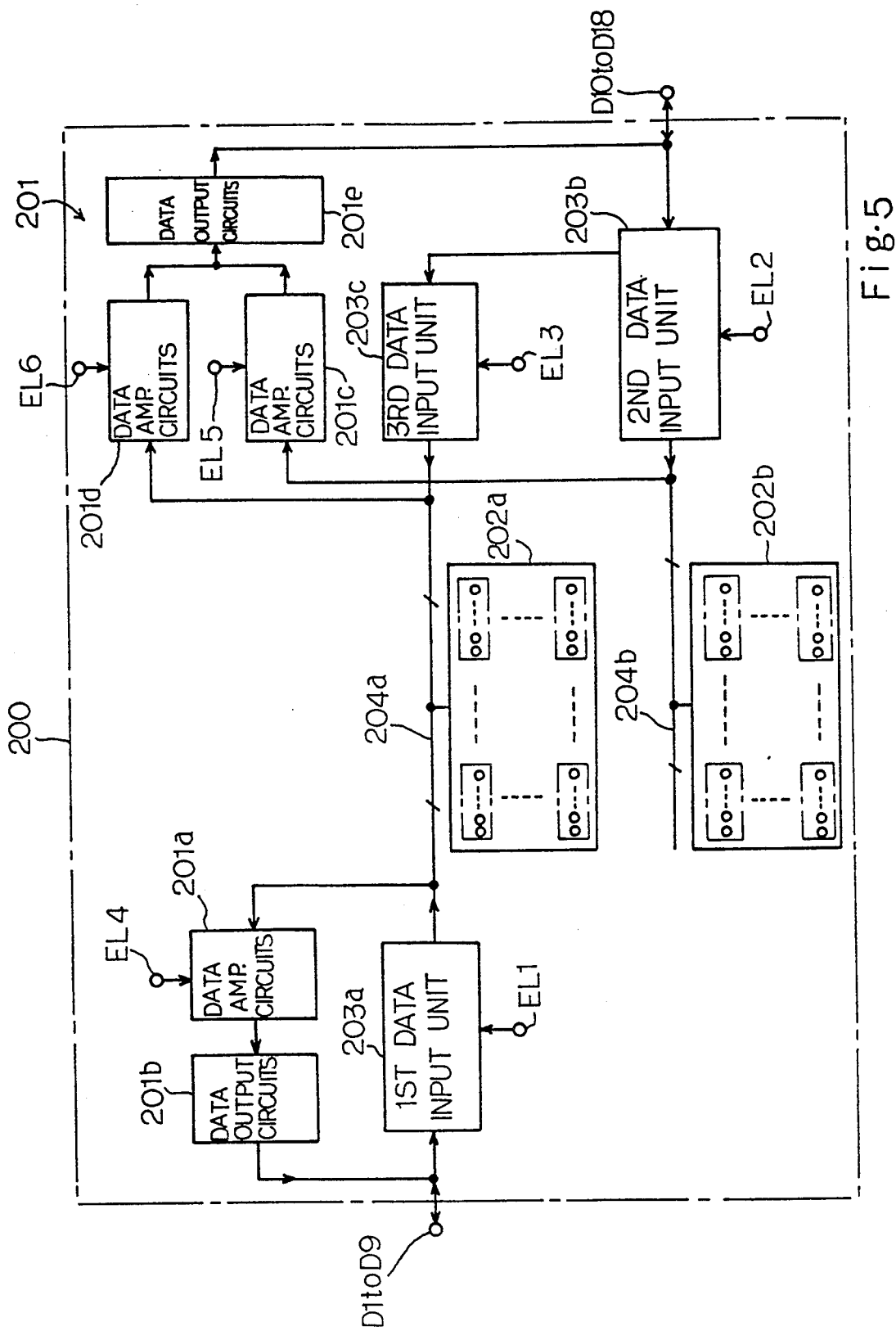

SEMICONDUCTOR MEMORY DEVICE FOR STORING N-BIT DATA AND 2N-BIT DATA WITHOUT TIME DELAY IN DATA PROPAGATION

FIELD OF THE INVENTION

This invention relates to a semiconductor memory device and, more particularly, to a semiconductor memory device equipped with a data port shared between an n-bit data code and a 2n-bit data code.

DESCRIPTION OF THE RELATED ART

A typical example of the semiconductor memory device for an n-bit data code and a 2n-bit data code is illustrated in FIG. 1 of the drawings, and the prior art semiconductor memory device comprises two memory cell arrays 1a and 1b each implemented by a plurality of memory cells arranged in matrix. In this instance, the memory cell arrays 1a and 1b store either nine-bit or eighteen-bit data codes, and, accordingly, an associated data input port has eighteen data pins P1,..., P9, P10, ... and P18.

The data pins P1 to P18 are respectively coupled with data input circuits 11, ..., 19, 20, ... and 28, and the data input circuits 11 to 20 are grouped into a first group associated with the memory cell array 1a and a second group associated with the memory cell array 1b. The data input circuits 11 to 19 are respectively coupled through data propagation lines 31 to 39 with the data input circuits 20 to 28, and the data input circuits 11 to 19 and the data input circuits 20 to 28 are respectively coupled through data bus systems 40a and 40b with the memory cell arrays 1a and 1b.

The data input circuits 11 to 19 of the first group are similar in arrangement to one another, and each of the data input circuits 11 to 19 comprises a data latch circuit 41, a switching circuit 42, a controlling circuit 43 and an output driver circuit 44. The data latch circuit 31 temporally stores a data bit at the associated data pin P1, ... or P9, and the switching unit 42 selectively couples the data latch circuit 41 and the associated one of the data propagation lines 31 to 39 with the controlling circuit 43 in response to a controlling signal CTL1. The controlling circuit 43 is implemented by two NOR gate NR1 and NR2, and the NOR gates NR1 and NR2 are enabled with a first enable signal EBL1 of active low voltage level corresponding to logic "0" level. While the NOR gates NR1 and NR2 are enabled, the NOR gates NR1 and NR2 are responsive to the data bit at the output node of the switching circuit 42, and cause the output driver circuit 44 to drive an associated data input/output line of the data bus system 40a. Namely, the output driver circuit 44 is implemented by a series combination of a p-channel enhancement type switching transistor Qp1 and an n-channel enhancement type switching transistor Qn2 coupled between a power voltage line Vcc and a ground voltage line GND, and the output nodes of the NOR gates NR1 and NR2 are respectively coupled with the gate electrode of the p-channel enhancement type switching transistor Qp1 and with the gate electrode of the n-channel enhancement type switching transistor Qn2. The common drain node N1 is coupled with the data input/output line of the data bus system 40a. The p-channel enhancement type switching transistor Qp1 and the n-channel enhancement type switching transistor Qn2 are complementarily shifted between on-state and off-state, and the data input/output line is charged to the power voltage level Vcc or discharged to the ground voltage level.

The data input circuits 20 to 28 are also similar in circuit arrangement to one another, and each of the data input circuits 20 to 28 comprises a data latch circuit 45, a controlling circuit 46 and an output driver circuit 47. The data latch circuit 45 temporally stores a data bit at the associated data pin, and the output node of the data latch circuit 45 is coupled with the associated data propagation line 31, .... or 39 as well as with the controlling circuit 46. The controlling circuit 46 is implemented by two NOR gates NR3 and NR4, and the NOR gates NR3 and NR4 are enabled with a second enable signal EBL2. While the NOR gates NR3 and NR4 are enabled, the NOR gates NR3 and NR4 serve as inverters on a data bit at the output node of the data latch circuit 45. The output driver circuit 47 is implemented by a series combination of a p-channel enhancement type switching transistor Qp3 and an n-channel enhancement type switching transistor Qn4 coupled between the power voltage line Vcc and the ground voltage line GND, and the p-channel enhancement type switching transistor Qp3 and the n-channel enhancement type switching transistor Qn4 are complementarily gated by the NOR gates NR3 and NR4.

The common drain node N2 is coupled with a data input/output line of the data bus system 40b, and the data input/output line is charged to the power voltage level or discharged to the ground voltage level depending upon the data bit at the output node of the data latch circuit 45.

The semiconductor memory device thus arranged can serve as a data storage for nine-bit data codes or eighteen-bit data codes. Description is hereinbelow made on behaviors of the prior art semiconductor memory device with reference to FIGS. 2A and 2B. However, the description is focused on the data input circuits 11 and 20 only for the sake of simplicity. The output node of the switching circuit 42 and the output node of the data latch circuit 45 are labeled with "N3" and "N4", respectively.

While serving as a data storage for eighteen-bit data codes, the semiconductor memory device causes the switching circuits 42 of the data input circuits 11 to 19 to couple the data latch circuits 41 with the controlling circuits 43, and both first and second enable signals EBL1 and EBL2 enable the controlling circuits 43 and 46 at an appropriate timing. Assuming now that data bits of logic "0" level cause the data pins P1 and P10 to go down to the low voltage level at time t1 as shown in FIG. 2A, the data latch circuits 41 and 45 temporally store the data bits of logic "0" level, and the data bits of logic "0" level are transferred to the controlling circuits 43 and 46, respectively. Although the data propagation path 31 propagates the data bit stored in the data latch circuit 45 to the data input circuit 11, the switching circuit 42 blocks the data bit. As a result, the nodes N3 and N4 are concurrently go down to the low voltage level at time t2.

The first and second enable signals EBL1 and EBL2 concurrently go down to the active low voltage level at time t3, and all of the NOR gates NR1 to NR4 are enabled with the first and second enable signals EBL1 and EBL2. The data bits of logic "0" level at the nodes N3 and N4 change the common drain nodes N1 and N2 to the high voltage level, and the n-channel enhancement type switching transistors Qn2 and Qn4 turn on.

However, the p-channel enhancement type switching transistors Qp1 and Qp3 are turned off. As a result, the common drain nodes N1 and N2 are grounded through the n-channel enhancement type switching transistors Qn2 and Qn4, and concurrently go down to the low voltage level at time t4. Thus, all of the data input circuits 11 to 28 concurrently drive the data input/output lines of the data bus systems 40a and 40b for the eighteen-bit data code.

However, while serving as a data storage for nine-bit data codes, the semiconductor memory device causes the switching circuit 42 to couple the data propagation paths 31 to 39 with the controlling circuits 43 of the data input circuits 11 to 19, and selectively decays first and second enable signals EBL1 and EBL2 to the active low voltage level depending upon the memory cell array 1a or 1b available for the nine-bit data code. The nine data bits are supplied to the data pins P10 to P18, and the data pins P1 to P9 stand idle. In detail, if a data bit of logic "0" level is applied to the data pin P10, the data pin P10 is decayed to the low voltage level at time t10, and the data bit of logic "0" level is stored in the data latch circuit 45. The output node N4 goes down to the low voltage level at time t12. However, the data propagation path 39 reaches the low voltage level at time t14. If the nine-bit data code is directed to the memory cell array 1a, the prior art semiconductor memory device shifts the first enable signal EBL1 to the active low voltage level at time t13, and keeps the second enable signal EBL2 at the inactive high voltage level. Even though the first enable signal EBL1 reaches the low voltage level at time t13, the data propagation path 31 is on the way to the low voltage level due to large parasitic capacitance coupled therewith, and the NOR gate NR1 and NR2 allow the n-channel enhancement type switching transistor Qn2 to start discharging the common drain node N1 at time t14. For this reason, the common drain node N1 goes down to the low voltage level at time t15. On the other hand, if the nine-bit data code is directed to the memory cell array 1b, the data input/output line is rapidly driven by the output driver circuit 47 as similar to the eighteen-bit data code.

Although FIG. 1 does not show any data output circuits, the prior art dynamic random access memory device is further equipped with two groups of data output circuits, and switching circuits of one group of data output circuits selectively couple the data input/output lines 31 to 39 directly with the data pins P1 to P9 or with the data pins P10 to P18 through data input/output lines 31 to 39. For this reason, the data access speed to a nine-bit data code is different between the memory cell arrays 1a and 1b.

Thus, the data bit of the nine-bit data code is propagated at different speed from the data bit of the eighteen-bit data code, and the prior art semiconductor memory device is expected to control the component circuits through different sequences or at a low speed for the ninebit data code. This results in complex sequences or slow write-in/read-out operations.

SUMMARY OF THE INVENTION

It is therefore an important object of the present invention to provide a semiconductor memory device which writes a data code at a constant speed regardless of the number of component bits.

To accomplish the object, the present invention proposes to supply n-bit data codes from a second data port to a first memory cell array by means of a data input unit exclusively used for the n-bit data codes.

In accordance with one aspect of the present invention, there is provided a semiconductor memory device fabricated on a single semiconductor chip, comprising: a) a first memory cell array having a plurality of addressable memory locations for storing n-bit data codes, and located in a first sub-area of a central area; b) a second memory cell array having a plurality of addressable memory locations for storing n-bit data codes, and located in a second sub-area, the first and second memory cell arrays further providing a plurality of addressable memory locations for storing 2n-bit data codes; c) a first data bus coupled with the first memory cell array for propagating the n-bit data codes or n-bits of the 2n-bit data codes to the first memory cell array; d) a second data bus coupled with the second memory cell array for propagating the n-bit data codes or the other n-bits of the 2n-bit data codes to the second memory cell array; e) a first data input unit located in the vicinity of the first sub-area on one side of the central area, and coupled with the first data bus, the first data input unit being enabled with a first enable signal for transferring the n-bits of the 2n-bit data codes from a first data input port to the first data bus; f) a second data input unit located in the vicinity of the second sub-area on the other side of the central area, and coupled with the second data bus, the second data input unit being enable with a second enable signal for transferring the n-bit data codes and the other n-bits of the 2n-bit data codes from a second data input port to the second data bus; and g) a third data input unit located in the vicinity of the first sub-area on the other side of the central area, and coupled with the first data bus, the third data input unit being enabled with a third enable signal for transferring the n-bit data codes from the second data input port to the first data bus.

In accordance with another aspect of the present invention, there is provided a semiconductor memory device fabricated on a single semiconductor chip, comprising: a) a first memory cell array having a plurality of addressable memory locations for storing n-bit data codes, and located in a first sub-area of a central area; b) a second memory cell array having a plurality of addressable memory locations for storing n-bit data codes, and located in a second sub-area, the first and second memory cell arrays further providing a plurality of addressable memory locations for storing 2n-bit data codes; c) a first data bus coupled with the first memory cell array for propagating the n-bit data codes or n-bits of the 2n-bit data codes from the first memory cell array; d) a second data bus coupled with the second memory cell array for propagating the n-bit data codes or the other n-bits of the 2n-bit data codes from the second memory cell array; e) a first data output unit located in the vicinity of the first sub-area on one side of the central area, and coupled with the first data bus, the first data output unit being enabled with a first enable signal for transferring the end bits of the 2n-bit bit data codes from the first data bus to a first data output port; f) a second data output unit located in the vicinity of the second sub-area on the other side of the central area, and coupled with the second data bus, the second data output unit being enable with a second enable signal for transferring the n-bit data codes and the other n-bits of the 2n-bit data codes from the second data bus to a second data output port; and g) a third data output unit located in the vicinity of the first sub-area on the other side of the central area, and coupled with the first data bus, the third data output unit being enabled with a third enable signal for transferring the n-bit data codes from the first data bus to the second data output port.

BRIEF DESCRIPTION OF THE DRAWINGS

The features and advantages of the semiconductor memory device according to the present invention will be more clearly understood from the following description taken in conjunction with the accompanying drawings in which:

FIG. 3 is a circuit diagram showing an essential part of a semiconductor memory device according to the present invention;

FIG. 5 is a circuit diagram showing an essential part of another semiconductor memory device according to the present invention.

DESCRIPTION OF THE PREFERRED EMBODIMENTS

First Embodiment

Figure 1:
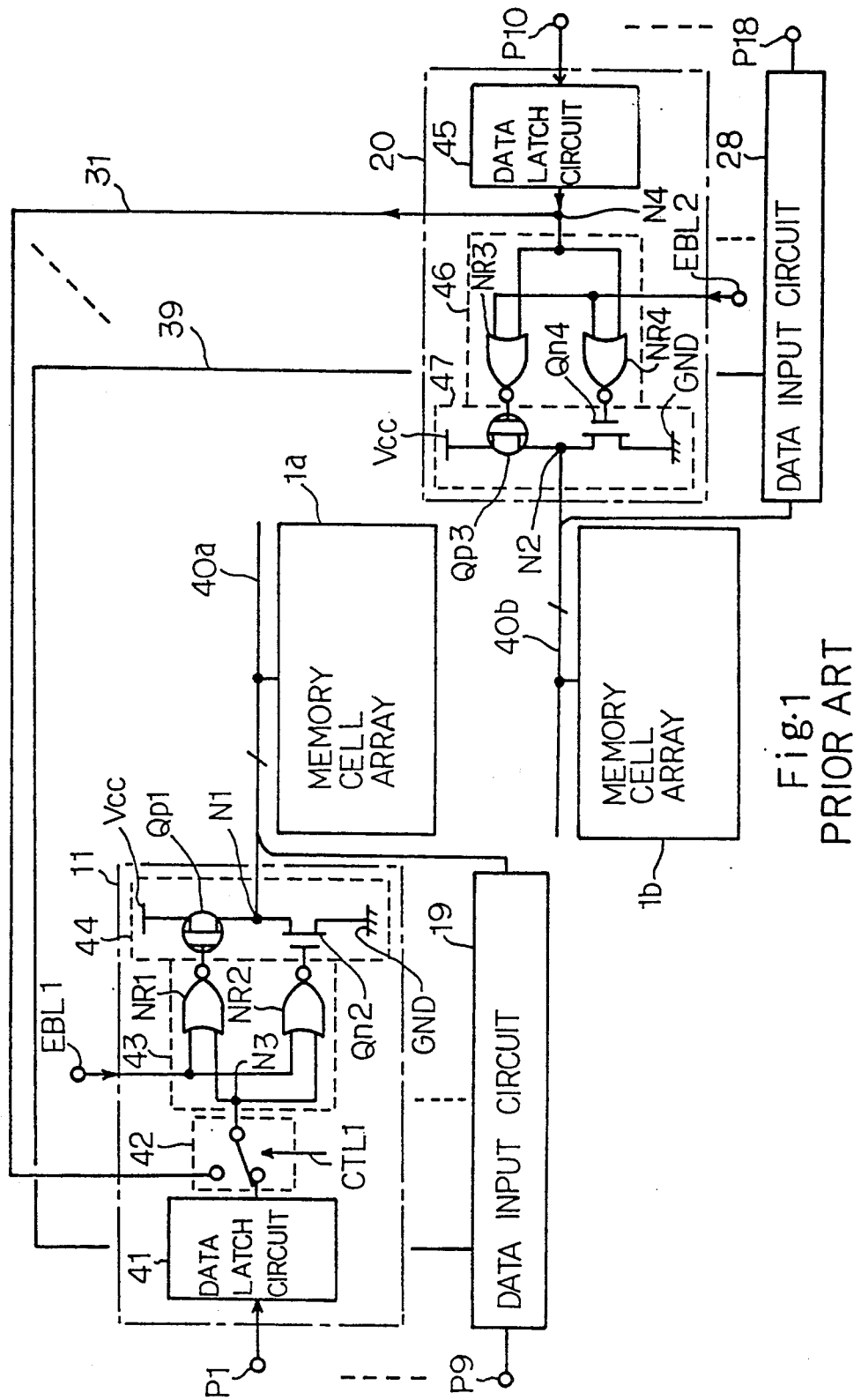
FIG. 1 is a circuit diagram showing the prior art semiconductor memory device.
Figure 2A:
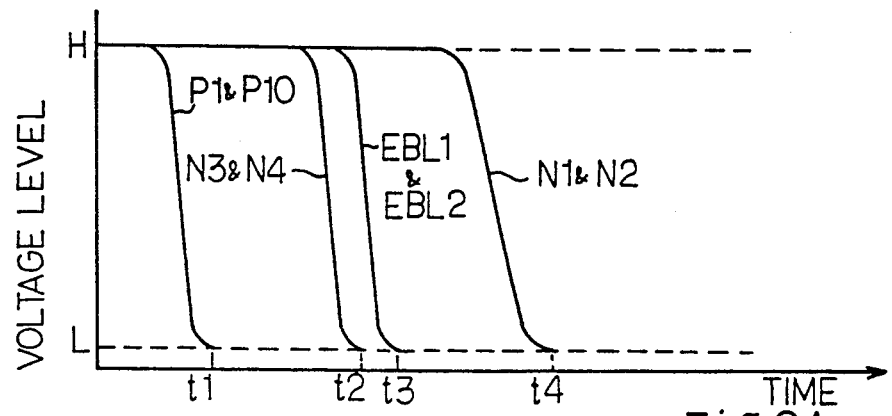
FIGS. 2A and 2B are diagrams showing the waveforms on the essential signal lines of the prior art semiconductor memory device.
Figure 2B:
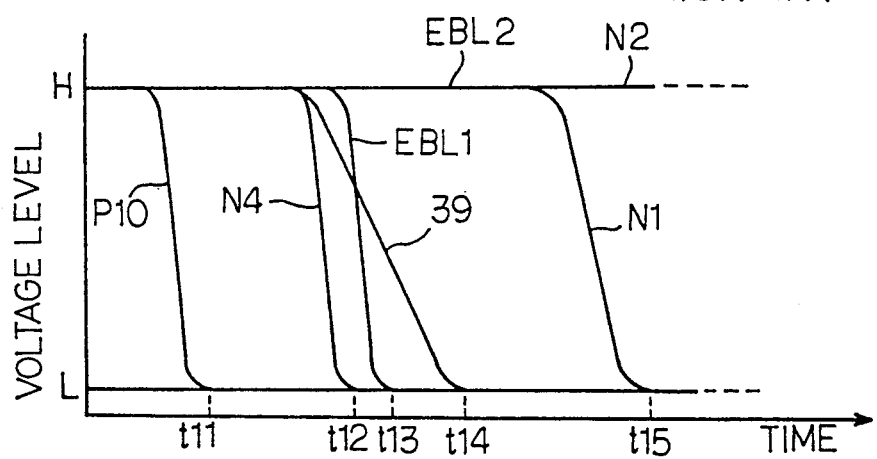

Referring to FIG. 3 of the drawings, a semiconductor memory device is fabricated on a semiconductor chip 100, and largely comprises first and second memory cell arrays 101a and 101b, an addressing system, a controlling system and a data write-in system. Although other systems such as, for example, a data read-out system and a power supply system are further incorporated in the semiconductor memory device, they are omitted from FIG. 3 for the sake of simplicity.

The first memory cell array 101 are fabricated from a plurality of memory cells, and small bubbles stand for the memory cells. Every nine memory cells form in combination an addressable memory locations ADA11, ADA1n, ADAm1 or ADAmn, and a nine-bit data code or nine bits of an eighteen-bit data code is stored in every addressable memory location ADA11, ADA1n, ADAm1 or ADAmn. The addressable memory locations ADA11 to ADAmn are respectively paired with the addressable memory locations ADB11 to ADBmn for the eighteen-bit data codes.

The second memory cell array 101b is similarly fabricated from a plurality of memory cells also represented by small bubbles, and every nine memory cells constitute an addressable memory locations ADB11, ADB1n, ADBm1 or ADBmn. A nine-bit data code or the other nine bits of the eighteen-bit data code is stored in every addressable memory location ADB11, ADB1n, ADBm1 or ADBmn.

The addressing system comprises an address buffer unit 102a, a first addressing unit 102b associated with the first memory cell array 101a and a second addressing unit 102c associated with the second memory cell array 101b. External address bits are temporally stored in the address buffer unit 102a, and are predecoded into address predecoded signals. The address predecoded signals are distributed to the first addressing unit 102b and to the second addressing unit 102c. The first addressing unit 102b is responsive to the address predecoded signals, and selects an addressable memory location from the first memory cell array 101a. Similarly, the second addressing unit 102c is responsive to the address predecoded signals, and selects an addressable memory location from the second memory cell array 101b.

The controlling system comprises a timing controller 103, and the timing controller 103 is responsive to the address predecoded signals and an external control signal BT indicative of either nine-bit or eighteen-bit data code stored in the first and second memory cell arrays 101a and 101b for selectively producing first, second and third enable signals EL1, EL2 and EL3. In this instance, the first and third enable signals EL1 and EL3 are active high voltage level, and the second enable signal EL2 is active low voltage level. While the semiconductor memory device is expected to serve as a data storage for nine-bit data codes, the timing controller 103 selectively produces the second and third enable signals EL2 and EL3 at an appropriate timing depending upon the address indicated by the external address bits. On the other hand, if the external control signal BT is indicative of the eighteen-bit data code, the timing controller 103 concurrently produces the first and third enable signals EL1 and EL3 at the appropriate timing. Although the timing controller 103 further produces various timing control signals for controlling a write-in sequence and a read-out sequence, they are not described hereinbelow, because they area less important for understanding the present invention.

The write-in system comprises a first data latch unit 110, a first data input unit 120, a second data latch unit 130, a second data input unit 140 and a third data input unit 150. The first and second memory cell arrays 101a and 101b are located in a central area of a major surface of the semiconductor chip 100, and occupy a first sub-area and a second sub-area, respectively. The first data input unit 120 is located on the left side of the first memory cell array 101a, and is coupled with the left end portion of a first input/ output data bus 160a. The second data input unit 140 is located on the right side of the second memory cell array 101b, and is coupled with the right end portion of a second data input/ output data bus 160b. The third data input unit 150 is located on the right side of the first memory cell array 101a, and directly coupled with the right end portion of the first input/ output data bus 160a. Therefore, any data propagation path is not incorporated in the semiconductor memory device according to the present invention.

The first data latch unit 110 is implemented by nine data latch circuits 111 to 119 respectively coupled with input/ output data pins D1 to D9, and the second data latch unit 130 is also implemented by nine data latch circuits 131 to 139 respectively coupled with input/ output data pins D10 to D18. Not only the data input/ output pins D1 to D18 but also the first and second input/ output data buses 160a and 160b are shared between the write-in system and the read-out system (not shown). The input/ output data pins D1 to D9 and the input/ output data pins D10 to D18 respectively serve as a first data input port and a second data input port.

The first data input unit 120 comprises nine data input circuits 121 to 129 identical in circuit arrangement with one another and the nine data input circuits 121 to 129 are coupled between the data latch circuits 111 to 119 and the first input/ output data bus 160a. Each of the data input circuits 121 to 129 comprises a controller 120a enabled with the first enable signal EL1 and a driver 120b controlled by the controller 120a for driving one of the input/output data line of the data bus 160a.

In detail, the controller 120a comprises an inverter 120c for producing a complementary enable signal CEL1 from the first enable signal EL1, a NAND gate 120d enabled with the first enable signal EL1 and a NOR gate 120e enabled with the complementary enable signal CEL1. The driver 120b is implemented by a series combination of a p-channel enhancement type switching transistor Qp11 and an n-channel enhancement type switching transistor Qn12 coupled between a positive power voltage line Vcc and a ground voltage line GND, and the NAND gate 120d and the NOR gate 120e cause the p-channel enhancement type switching transistor Qp11 and the n-channel enhancement type switching transistor Qn12 to complementarily turn on and off depending upon the logic level of a data bit latched by the associated data latch circuit. Namely, one of the nine bits of the eighteen-bit data code is supplied from the associated data latch circuit through a node N1 to both NAND and NOR gates 120d and 120e, and the p-channel enhancement type switching transistor Qp11 and the n-channel enhancement type switching transistor Qn12 are respectively gated by the NAND gate 120d enabled with the first enable signal EL1 and by the NOR gate 120e enabled with the complementary enable signal CEL1. If the data bit latched by the data latch circuit is logic "1" level corresponding to the positive high voltage level, the NAND gate 120d allows the p-channel enhancement type switching transistor Qp11 to turn on, keeping the n-channel enhancement type switching transistor Qn12 off. Then, the data input/output signal line of the data bus 160a is driven to the positive high voltage level. On the other hand, if the data bit is logic "0" level corresponding to the low voltage level, the NOR gate 120e allows the n-channel enhancement type switching transistor Qn12 to turn on, keeping the p-channel enhancement type switching transistor Qp11 off. Then, the data input/output signal line of the data bus 160a is driven to the low voltage level.

The second data input unit 140 also comprises nine data input circuits 141 to 149 identical in circuit arrangement with one another, and the nine data input circuits 141 to 149 are coupled between the data latch circuits 131 to 139 and the second input/output data bus 160b. Each of the data input circuits 141 to 149 comprises a controller 140a enabled with the second enable signal EL2 and a driver 140b for driving one of the input/output data line of the data bus 160b.

In detail, the controller 140a comprises two NOR gates 140c and 140d enabled with the second enable signal EL2, and the driver 140b is implemented by a series combination of a p-channel enhancement type switching transistor Qp13 and an n-channel enhancement type switching transistor Qn14 coupled between the positive power voltage line Vcc and the ground voltage line GND, and the NOR gates 140c and 140d cause the p-channel enhancement type switching transistor Qp13 and the n-channel enhancement type switching transistor Qn14 to complementarily turn on and off depending upon the logic level of a data bit latched by the associated data latch circuit. Namely, a bit of the nine-bit or eighteen-bit data code is supplied from the associated data latch circuit through a node N2 to both NOR gates 140c and 140d, and the p-channel enhancement type switching transistor Qp13 and the n-channel enhancement type switching transistor Qn14 are respectively gated by the NOR gates 140c and 140d enabled with the second enable signal EL2. If the data bit latched by the associated data latch circuit is logic "1" level, the NOR gate 140c allows the p-channel enhancement type switching transistor Qp13 to turn on, and the data input/output signal line of the data bus 160b is driven to the positive high voltage level. On the other hand, if the data bit is logic "0" level, the NOR gate 140d allows the n-channel enhancement type switching transistor Qn14 to turn on, and the data input/output signal line of the data bus 160b is driven to the low voltage level.

The third data input unit 150 also comprises nine data input circuits 151 to 159 identical in circuit arrangement with one another, and the nine data input circuits 151 to 159 are coupled between the data latch circuits 131 to 139 and the first input/output data bus 160a. Each of the data input circuits 151 to 159 comprises a controller 150a enabled with the third enable signal EL3 and a driver 150b controlled by the controller 150a for driving one of the input/output data line of the data bus 160a.

In detail, the controller 150a comprises an inverter 150c for producing a complementary enable signal CEL3 from the first enable signal EL3, a NAND gate 150d enabled with the third enable signal EL3 and a NOR gate 150e enabled with the complementary enable signal CEL3. The driver 150b is implemented by a series combination of a p-channel enhancement type switching transistor Qp15 and an n-channel enhancement type switching transistor Qn16 coupled between the positive power voltage line Vcc and the ground voltage line GND, and the NAND gate 150d and the NOR gate 150e cause the p-channel enhancement type switching transistor Qp15 and the n-channel enhancement type switching transistor Qn16 to complementarily turn on and off depending upon the logic level of a data bit latched by the associated data latch circuit. Namely, one of the nine bits of the nine-bit data code is supplied from the associated data latch circuit through a node N3 to both NAND and NOR gates 150d and 150e, and the p-channel enhancement type switching transistor Qp15 and the n-channel enhancement type switching transistor Qn16 are respectively gated by the NAND gate 150d enabled with the third enable signal EL3 and by the NOR gate 150e enabled with the complementary enable signal CEL3. If the data bit latched by the data latch circuit is logic "1" level, the NAND gate 150d allows the p-channel enhancement type switching transistor Qp15 to turn on, keeping the n-channel enhancement type switching transistor Qn16 off. Then, the data input/output signal line of the data bus 160a is driven to the positive high voltage level. On the other hand, if the data bit is logic "0" level, the NOR gate 150e allows the n-channel enhancement type switching transistor Qn16 to turn on, keeping the p-channel enhancement type switching transistor Qp15 off. Then, the data input/output signal line of the data bus 160a is driven to the low voltage level.

Figure 4A:
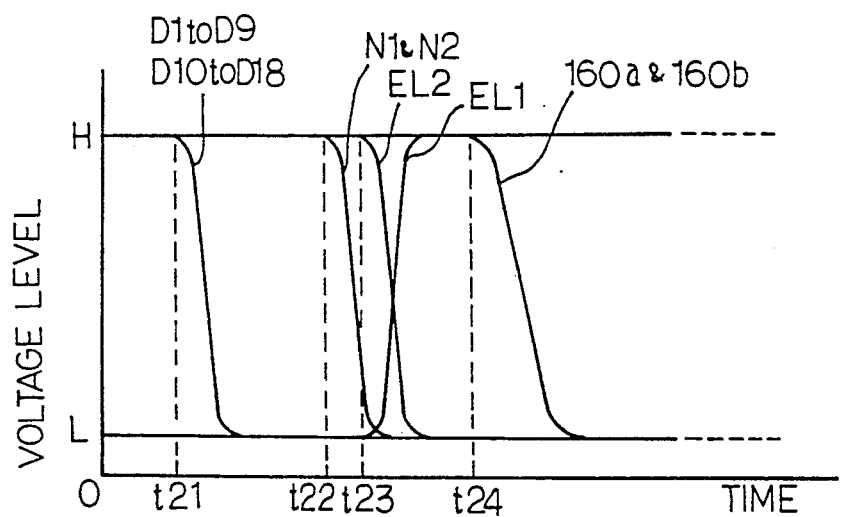
FIGS. 4A to 4C are diagrams showing the waveforms on the essential signal lines of the semiconductor memory device.

Description is hereinbelow made on write-in sequences with reference to FIGS. 4A and 4B of the drawings. Firstly, the external control signal BT is assumed to indicate an eighteen-bit data code, and the eighteen-bit data code consists of logic "0" bits. The first addressing unit 102a selects one of the addressable memory locations ADA11 to ADAmn from the first memory cell array 101a assigned the address indicated by the external address bits, and the second addressing unit 102b also selects one of the addressable memory locations ADB11 to ADBmn paired with that of the first memory cell array 101a. The selected addressable memory locations become ready for a write-in operation.

The eighteen-bit data code starts the data input/ output pins D1 to D9 and D10 to D18 to go down at time t21, and is latched by the first and second data latch units 110 and 130. The nodes N1 and N2 go down to the low voltage level at time t22, and the timing controller 103 shifts the first enable signal EL1 to the high voltage level and the second enable signal EL2 to the low voltage level at time t23. Then, the controller 120a is enabled with the first enable signal EL1 and the complementary enable signal CEL1, and the controller 140a is enabled with the second enable signal EL2. The data bits of logic "0" level cause the NAND gates 120d, the NOR gates 120e and the NOR gates 140c and 140d to supply output signals of the high voltage level to the p-channel enhancement type switching transistors Qp11, the n-channel enhancement type switching transistors Qn12, the p-channel enhancement type switching transistors Qp13 and the n-channel enhancement type switching transistors Qn14, respectively. The n-channel enhancement type switching transistors Qn12 and Qn14 turn on, and the p-channel enhancement type switching transistors Qp11 and Qp13 are turned off. As a result, the drivers 120b and 140b start the first input/ output data bus 160a and the second input/ output data bus 160b to go down at time t24, and the data bits of logic "0" level are written into the selected addressable memory locations.

On the other hand, while the external control signal BT is indicative of a nine-bit data code, the nine data bits are applied to the data input/ output pins D10 to D18, and voltage levels at the data input/ output pins D1 to D9 are invalid. A nine-bit data code is assumed to consist of data bits of logic "0" level in the following description.

If the external address bits are indicative of one of the addressable memory locations ADA11 to ADAmn of the first memory cell array 101a, the first addressing unit 102b selects the addressable memory location assigned the address indicated by the external address bits, and causes the addressable memory location to be ready for the write-in operation.

Figure 4B:
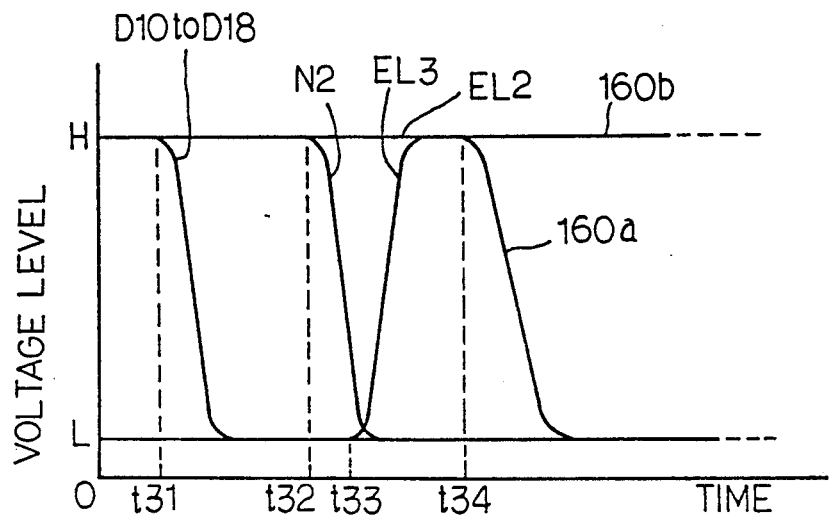

As shown in FIG. 4B, the nine data bits start the data input/ output pins D10 to D18 to go down at time t31, and the nine-bit data code is latched by the data latch circuits 131 to 139. Then, the nodes N2 are decayed at time t32, and the timing controller 103 start the third enable signal EL3 to go up to the active high voltage level at time t33. However, the second enable signal EL2 disables the NOR gates 140c and 140d.

The third enable signal EL3 of the active high voltage level and the complementary enable signal CEL3 cause the NAND gates 150d and the NOR gates 150e to become responsive to the data bits of logic "0" level. The NAND gates 150d and the NOR gates 150e produce the output signals of logic "1" level, and the n-channel enhancement type switching transistors Qn16 turn on. However, the p-channel enhancement type switching transistors Qp15 are turned off. As a result, the first input/ output data bus starts to go down at time t34, and the data bits of logic "0" level is written into the selected addressable memory location.

On the other hand, if the external address bits are indicative of one of the addressable memory locations ADB11 to ADBmn of the second memory cell array 101b, the second addressing unit 102c selects the addressable memory location assigned the address indicated by the external address bits, and causes the addressable memory location to be ready for the write-in operation.

Figure 4C:
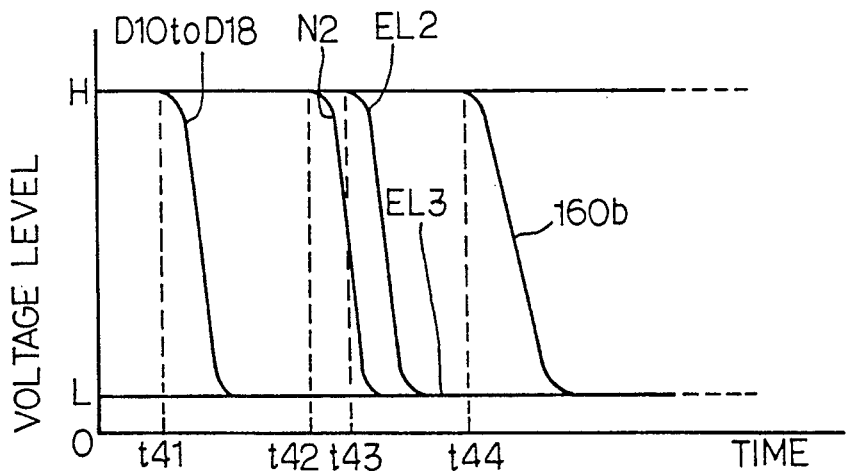

As shown in FIG. 4C, the nine data bits start the data input/ output pins D10 to D18 to go down at time t41, and the nine-bit data code is latched by the data latch circuits 131 to 139. Then, the nodes N2 are decayed at time t42, and the timing controller 103 start the second enable signal EL2 to go down to the active low voltage level at time t43. However, the third enable signal EL3 is kept at the inactive low voltage level, and the third enable signal EL3 and the complementary enable signal CEL3 disable the NAND gates 150d and the NOR gates 150e. The NAND gates 150d and the NOR gates 150e keep the p-channel enhancement type switching transistors Qp15 and the n-channel enhancement type switching transistors Qn16 off, and the drivers 150b enter the high-impedance state.

The second enable signal EL2 of the active low voltage level causes the NOR gates 140c and 140d to become responsive to the data bits of logic "0" level. The NOR gates 140c and 140d produce the output signals of logic "1" level, and the n-channel enhancement type switching transistors Qn14 turn on. However, the p-channel enhancement type switching transistors Qp13 are turned off. As a result, the second input/ output data bus 160b starts to go down at time t44, and the data bits of logic "0" level is written into the selected addressable memory location.

Comparing FIG. 4B with FIG. 4C, it is understood that the nine-bit data codes are written into the first and second memory cell arrays 101a and 101b at the same speed. This is because of the fact that the third data input unit 150 is provided on the same side as the second data input unit 140 instead of the data propagation paths 31 to 39. Thus, the semiconductor memory device according to the present invention achieves the high-speed write-in without any complex sequence.

Second Embodiment

Turning to FIG. 5 of the drawings, another semiconductor memory device embodying the present invention is fabricated on a semiconductor chip 200. FIG. 5 focuses attention on a read-out system 201, and the other systems such as an addressing system and a controlling system are deleted from FIG. 5 for the sake of simplicity.

The read-out system 201 is associated with first and second memory cell arrays 202a and 202b, and the first and second memory cell arrays 202a and 202b are corresponding to the first and second memory cell arrays 101a and 101b.

The semiconductor memory device further comprises a write-in system, and first, second and third data input units 203a, 203b and 203c form the write-in system. The first, second and third data input units 203a to 203c are equivalent to the first to third data input units 120, 140 and 150 associated with the first and second data latch units 110 and 130, and are selectively enabled with first, second and third enable signals EL1, EL2 and EL3 as similar to the first embodiment. Thus, the write-in system incorporated in the second embodiment is analogous from that of the first embodiment, and no further description is incorporated hereinbelow for avoiding repetition.

The read-out system 201 shares first and second input/output data buses 204a and 204b with the write-in system, and comprises a plurality of first data amplifier circuits 201a coupled with the first input/output data bus 204a, a plurality of first data output circuits 201b coupled between the first data amplifier circuits 201a and the input/output data pins D1 to D9, a plurality of second data amplifier circuits 201c coupled with the second input/output data bus 204b, a plurality of third data amplifier circuits 201d coupled with the first input/output data bus 204a, and a plurality of second data output circuits 201e coupled between said second and third data amplifier circuits 201c and 201d and the input/output data pins D10 to D18.

In this instance, the first data amplifier circuits 201a and the first data output circuits 201b form in combination a first data output unit, and the data amplifier circuits 201c and the second data output circuits 201e as a whole constitute a second data output unit. The second data output circuits 201e further form a third data output unit together with the third data amplifier circuits 201d.

If the memory cell arrays 204a and 204b store 2n-bit data codes, the first data amplifier circuits 201a and the second data amplifier circuits 201c are enabled with fourth and fifth enable signals EL4 and EL5, and n bits of a 2n-bit data code and the other n bits of the 2n-bit data code are respectively supplied from the first input/output data bus 204a and the second input/output data bus 204b to the first data amplifier circuits 201a and the second data amplifier circuits 201c, respectively. After amplification, the n-bits and the other n-bits are supplied to the first data output circuits 201b and the second data output circuits 201e, and the first data output circuits 201b and the second data output circuits 201e drive the input/output data pins D1 to D9 and the input/output data pins D10 to D18, respectively.

However, if an n-bit data code is read out from the first memory cell array 202a to the input/output data bus 204a, the sixth enable signal EL6 enables the third data amplifier circuits 201d, and the n-bit data code is amplified. After the amplification, the n-bit data code is supplied to the second output circuits 201e, and the second output circuits 201e drive the input/output data pins D10 to D18.

On the other hand, if an n-bit data code is read out from the second memory cell array 202b to the input/output data bus 204b, the fifth enable signal EL5 enables the second data amplifier circuits 201c, and the n-bit data code is amplified thereat. After the amplification, the n-bit data code is supplied to the second output circuits 201e, and the second output circuits 201e drive the input/output data pins D10 to D18.

As will be understood from the foregoing description, the semiconductor memory device according to the present invention is equipped with the third data amplifier circuits 201d exclusively used for the n-bit data codes read out from the first memory cell array 202a, and any substantial time delay does not take place between the n-bit data codes read out from the first memory cell array 202a and the n-bit data codes read out from the second memory cell array 202b, because the data propagation path to the second data amplifier circuits 201c is substantially equal to the data propagation path to the third data amplifier circuits 201d. As a result, the access time to the n-bit data codes is shortened regardless of the memory cell array.

Although particular embodiments of the present invention have been shown and described, it will be obvious to those skilled in the art that various changes and modifications may be made without departing from the spirit and scope of the present invention. For example, a semiconductor memory device according to the present invention may have more than two memory cell arrays associated with the data input/output circuits according to the present invention, and the more than two memory cell arrays may be grouped into a first memory cell array block and a second memory cell array block corresponding to the first and second memory cell arrays. Moreover, arbitrary memory cells may constitute an addressable memory location, and a semiconductor memory device according to the present invention may be integrated with other function blocks.

What is claimed is:

1. A semiconductor memory device fabricated on a single semiconductor chip, comprising:
   a) a first memory cell array having a plurality of addressable memory locations for storing n-bit data codes, and located in a first sub-area of a central area;
   b) a second memory cell array having a plurality of addressable memory locations for storing n-bit data codes, and located in a second sub-area, said first and second memory cell arrays further providing a plurality of addressable memory locations for storing 2n-bit data codes;
   c) a first data bus coupled with said first memory cell array for propagating said n-bit data codes or n-bits of said 2n-bit data codes to said first memory cell array;
   d) a second data bus coupled with said second memory cell array for propagating said n-bit data codes or the other n-bits of said 2n-bit data codes to said second memory cell array;
   e) a first data input unit located in the vicinity of said first sub-area on one side of said central area, and coupled with said first data bus, said first data input unit being enabled with a first enable signal for transferring said n-bits of said 2n-bit data codes from a first data input port to said first data bus;
   f) a second data input unit located in the vicinity of said second sub-area on the other side of said central area, and coupled with said second data bus, said second data input unit being enable with a second enable signal for transferring said n-bit data codes and said other n-bits of said 2n-bit data codes from a second data input port to said second data bus; and
   g) a third data input unit located in the vicinity of said first sub-area on the other side of said central area, and coupled with said first data bus, said third data input unit being enabled with a third enable signal for transferring said n-bit data codes from said second data input port to said first data bus.

2. A semiconductor memory device as set forth in claim 1, in which first and second data latch units are respectively coupled between said first data input port and said first data input unit and between said second data input port and said second and third data input units, respectively.

3. A semiconductor memory device as set forth in claim 1, in which said first, second and third data input units are respectively implemented by a plurality of first data input circuits, a plurality of second data input circuits and a plurality of third data input circuits.

4. A semiconductor memory device as set forth in claim 3, in which each of said plurality of first data input circuits comprises a controller enabled with said first enable signal so as to become responsive to one of said n-bits of said 2n-bit data code, and a driver controlled by said controller for driving a data signal line of said first data bus.

5. A semiconductor memory device as set forth in claim 4, in which said controller comprises an inverter for producing a complementary enable signal of said first enable signal, a NAND gate enabled with said first enable signal and responsive to said one of said n-bits, and a NOR gate enabled with said complementary enable signal and responsive to said one of said n-bits of said 2n-bit data code, said driver comprising a first enhancement type switching transistor of one channel conductivity type having a gate electrode coupled with said NAND gate and a source node coupled with a first source of voltage level, and a second enhancement type switching transistor of the other channel conductivity type having a gate electrode coupled with said NOR gate, a drain node coupled with a drain node of said first enhancement type switching transistor and a source node coupled with a second source of power voltage level.

6. A semiconductor memory device as set forth in claim 5, in which each of said plurality of third data input circuits comprises a controller enabled with said third enable signal so as to become responsive to one of said n-bits of said n-bit data code, and a driver controlled by said controller enabled with said third enable signal for driving a data signal line of said first data bus.

7. A semiconductor memory device as set forth in claim 6, in which said controller enabled with said third enable signal comprises an inverter for producing a complementary enable signal of said third enable signal, a NAND gate enabled with said third enable signal and responsive to said one of said n-bits of said n-bit data code, and a NOR gate enabled with said complementary enable signal of said third enable signal and responsive to said one of said n-bits of said n-bit data code, said driver comprising a third enhancement type switching transistor of said one channel conductivity type having a gate electrode coupled with said NAND gate enabled with said third enable signal and a source node coupled with said first source of voltage level, and a fourth enhancement type switching transistor of said other channel conductivity type having a gate electrode coupled with said NOR gate enabled with said complementary enable signal of said third enable signal, a drain node coupled with a drain node of said third enhancement type switching transistor and a source node coupled with said second source of power voltage level.

8. A semiconductor memory device fabricated on a single semiconductor chip, comprising:

a) a first memory cell array having a plurality of addressable memory locations for storing n-bit data codes, and located in a first sub-area of a central area;

b) a second memory cell array having a plurality of addressable memory locations for storing n-bit data codes, and located in a second sub-area, said first and second memory cell arrays further providing a plurality of addressable memory locations for storing 2n-bit data codes;

c) a first data bus coupled with said first memory cell array for propagating said n-bit data codes or n-bits of said 2n-bit data codes from said first memory cell array;

d) a second data bus coupled with said second memory cell array for propagating said n-bit data codes or the other n-bits of said 2n-bit data codes from said second memory cell array;

e) a first data output unit located in the vicinity of said first sub-area on one side of said central area, and coupled with said first data bus, said first data output unit being enabled with a first enable signal for transferring said n-bits of said 2n-bit data codes from said first data bus to a first data output port;

f) a second data output unit located in the vicinity of said second sub-area on the other side of said central area, and coupled with said second data bus, said second data output unit being enable with a second enable signal for transferring said n-bit data codes and said other n-bits of said 2n-bit data codes from said second data bus to a second data output port; and g) a third data output unit located in the vicinity of said first sub-area on the other side of said central area, and coupled with said first data bus, said third data output unit being enabled with a third enable signal for transferring said n-bit data codes from said first data bus to said second data output port.

9. A semiconductor memory device as set forth in claim 8, in which said first data output unit comprises a plurality of first data amplifier circuits coupled with the first data bus and enabled with a first enable signal, and a plurality of first data output circuits coupled between said plurality of first data amplifier circuits and a plurality of first data pins, said second data output unit comprising a plurality of second data amplifier circuits coupled with the second data bus and enabled with a second enable signal, and a plurality of second data output circuits coupled between said plurality of second data amplifier circuits and a plurality of second data pins, said third data output unit comprising a plurality of third data amplifier circuits coupled with the first data bus and enabled with a third enable signal, and said plurality of second data output circuits coupled between said plurality of third data amplifier circuits and said plurality of second data pins.

* * * * *